(12) United States Patent
Nallan et al.

(10) Patent No.: US 6,767,824 B2
(45) Date of Patent: Jul. 27, 2004

(54) METHOD OF FABRICATING A GATE STRUCTURE OF A FIELD EFFECT TRANSISTOR USING AN ALPHA-CARBON MASK

(76) Inventors: Padmapani C. Nallan, 2200 Pettigrew Dr., San Jose, CA (US) 95148; Ajay Kumar, 510 Kenilworth Ct., Sunnyvale, CA (US) 94087; Guangxiang Jin, 1738 Fumia Dr., San Jose, CA (US) 95131; Wei Liu, 5035 Moorpark Ave., San Jose, CA (US) 95129

( * ) Notice: Subject to any disclaimer, the term of this patent is extended or adjusted under 35 U.S.C. 154(b) by 0 days.

(21) Appl. No.: 10/338,251

(22) Filed: Jan. 6, 2003

(65) Prior Publication Data

US 2004/0058517 A1 Mar. 25, 2004

Related U.S. Application Data

(60) Provisional application No. 60/412,949, filed on Sep. 23, 2002.

(51) Int. Cl.$^7$ ............... H01L 21/4763; H01L 21/28; H01L 21/3205
(52) U.S. Cl. ............... 438/633; 438/606; 438/945
(58) Field of Search ............... 438/633, 606, 438/945, 702, 301, 494, 297, 703, 722

(56) References Cited

U.S. PATENT DOCUMENTS

| | | | | |
|---|---|---|---|---|
| 4,053,350 | A | * 10/1977 | Olsen et al. | 438/494 |
| 4,994,404 | A | * 2/1991 | Sheng et al. | 438/297 |
| 5,185,293 | A | * 2/1993 | Franke et al. | 438/606 |
| 5,240,554 | A | * 8/1993 | Hori et al. | 438/702 |
| 5,340,438 | A | * 8/1994 | Roselle et al. | 216/39 |
| 5,391,510 | A | * 2/1995 | Hsu et al. | 438/301 |
| 5,759,746 | A | * 6/1998 | Azuma et al. | 438/945 |
| 6,423,384 | B1 | 7/2002 | Khazeni et al. | 427/577 |
| 6,458,516 | B1 | * 10/2002 | Ye et al. | 438/703 |
| 6,472,312 | B2 | 10/2002 | Bao et al. | 438/633 |
| 6,511,872 | B1 | * 1/2003 | Donnelly et al. | 438/722 |
| 2001/0048095 | A1 | 12/2001 | Towie | 252/62.3 Q |
| 2002/0001778 | A1 | 1/2002 | Latchford et al. | 430/313 |

FOREIGN PATENT DOCUMENTS

EP   0 517 627 A1   12/1992   ......... H01L/21/308

* cited by examiner

*Primary Examiner*—John F. Niebling
*Assistant Examiner*—Walter L. Lindsay, Jr.
(74) *Attorney, Agent, or Firm*—Hoser, Patterson & Sheridan, NJ; Joseph Bach (57) ABSTRACT

A method of fabricating a gate structure of a field effect transistor comprising processes of forming an α-carbon mask and plasma etching a gate electrode and a gate dielectric using the α-carbon mask. In one embodiment, the gate dielectric comprises hafnium dioxide.

22 Claims, 7 Drawing Sheets

METHOD OF FABRICATING A GATE STRUCTURE OF A FIELD EFFECT TRANSISTOR USING AN ALPHA-CARBON MASK

CROSS-REFERENCE TO RELATED APPLICATIONS

This application claims benefit of U.S. provisional patent application serial No. 60/412,949, filed Sep. 23, 2002, which is herein incorporated by reference.

BACKGROUND OF THE INVENTION

1. Field of the Invention

The present invention generally relates to a method for fabricating devices on semiconductor substrates. More specifically, the present invention relates to a method for fabricating a gate structure of a field effect transistor.

2. Description of the Related Art

Ultra-large-scale integrated (ULSI) circuits typically include more than one million transistors that are formed on a semiconductor substrate and cooperate to perform various functions within an electronic device. The transistors generally are complementary metal-oxide-semiconductor (CMOS) field effect transistors comprising a gate structure disposed between a source region and a drain region that are formed in the semiconductor substrate. The gate structure comprises a gate electrode and a gate dielectric. The gate electrode is provided over the gate dielectric and controls a flow of charge carriers in a channel region formed between the drain and the source regions to turn the transistor on or off. There is a constant trend to reduce a width of the channel region, as well as the width of the gate structure, to thereby increase the overall speed of the transistor.

The advanced CMOS transistors generally utilize polysilicon gate electrodes formed upon a gate dielectric fabricated of very thin layers of hafnium dioxide ($HfO_2$), $HfSiO_2$, $Al_2O_3$, $ZrO_2$, barium strontium titanate (BST), lead zirconate titanate (PZT), $ZrSiO_2$, HfSiON, or $TaO_2$. Such materials have a high dielectric constant that is greater than 4.0 and are referred to as high-K materials.

To form a transistor, regions in the substrate are doped to form source and drain regions. A high K dielectric is deposited over the substrate. Polysilicon is then deposited over the dielectric layer and the polysilicon is then annealed at a high temperature. Typically, a photoresist mask may be used to pattern the gate structure. However, some high K dielectric materials can only be etched at high temperatures. The temperatures can be high enough to cause the photoresist material to reticulate. As such, in high temperature applications, a layer of silicon dioxide ($SiO_2$) is deposited over the polysilicon and a photoresist layer is deposited over the $SiO_2$. The photoresist layer is patterned and the $SiO_2$ is etched to form a hard mask. The photoresist material is then removed. The $SiO_2$ mask is used while etching the gate dielectric and removed thereafter. However, silicon dioxide has very poor selectivity with respect to polysilicon in fluorine-based cleaning chemistries. As such, when a cleaning process is activated, the mask is substantially eroded.

Therefore, there is a need in the art for a method for fabricating a gate structure of a field effect transistor using materials that are compatible with high temperatures and broad spectrum of chemistries.

SUMMARY OF THE INVENTION

The present invention is a method of fabricating a gate structure of a field effect transistor using an amorphous carbon mask. The method comprises processes of forming an α-carbon mask (i.e., mask that is formed from inorganic amorphous carbon) to define the gate structure, plasma etching a gate electrode and a gate dielectric using the α-carbon mask, and removing the α-carbon mask after the gate structure is formed. In one embodiment, the gate dielectric comprises at least one material layer having a dielectric constant greater than 4, e.g., hafnium dioxide ($HfO_2$), $HfSiO_2$, alumina ($Al_2O_3$), and the like.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

It is to be noted, however, that the appended drawings illustrate only exemplary embodiments of this invention and are therefore not to be considered limiting of its scope, for the invention may admit to other equally effective embodiments.

DETAILED DESCRIPTION

The present invention is a method of fabricating a gate structure of a field effect transistor, such as a complementary metal-oxide-semiconductor (CMOS) field effect transistor. The method comprises forming an α-carbon mask (i.e., inorganic amorphous carbon mask) upon a film stack comprising, from top to bottom, a gate electrode layer and a gate dielectric layer, and plasma etching the gate electrode and the gate dielectric using the α-carbon mask as an etch mask. The α-carbon mask topographically defines the gate structure and is disposed above the channel, source, and drain regions of the transistor that is being formed in the semiconductor substrate, (e.g., a silicon (Si) wafer). After the gate structure has been formed, the α-carbon mask may be removed.

Figure 1:
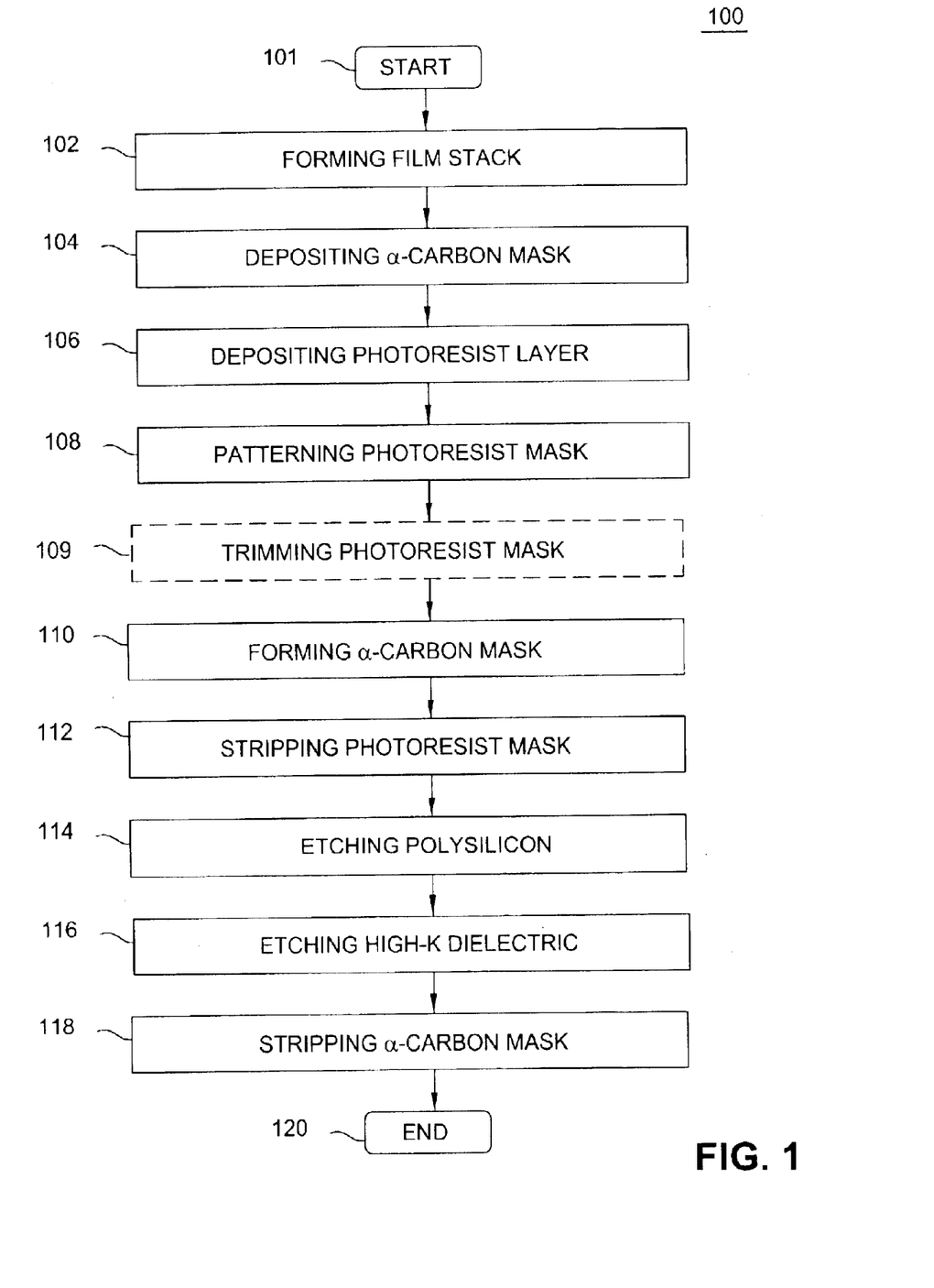
FIG. 1 depicts a flow diagram of a method of fabrication a gate structure in accordance with the present invention.

FIG. 1 depicts a flow diagram of a method of fabrication a gate structure in accordance with the present invention as a method 100. The method 100 comprises processes that are performed upon a film stack of the gate structure during fabrication of a field effect transistor (e.g., CMOS transistor).

FIGS. 2A–2J together depict a sequence of schematic, cross-sectional views of a substrate having a gate structure being formed in accordance with the method 100 of FIG. 1. The cross-sectional views in FIGS. 2A–2J relate to individual process steps that are used to form the gate structure. Sub-processes such as lithographic processes (e.g., exposure and development of photoresist, and the like), and wafer cleaning procedures among others are well known in the art and, as such, are not shown in FIG. 1 and FIGS. 2A–2J. The images in FIGS. 2A–2J are not depicted to scale and are simplified for illustrative purposes. Processes used during fabrication of the gate structure may be performed, for example, using, e.g., processing modules of CENTURA®, ENDURA® and other semiconductor wafer processing system available from Applied Materials, Inc. of Santa Clara, Calif.

Figure 2A:
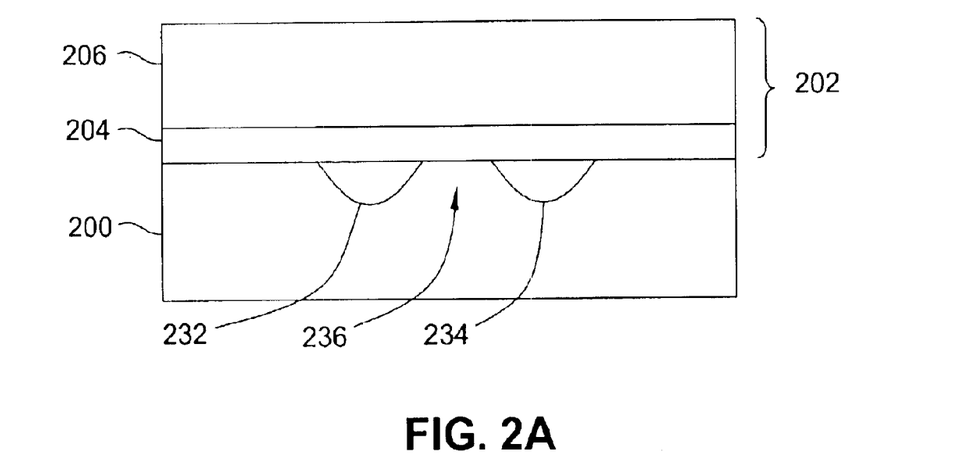
FIGS. 2A–2J together depict a sequence of schematic, cross-sectional views of a substrate having a gate structure being formed in accordance with the method of FIG. 1.

The method 100 starts at step 101 and proceeds to step 102, when a film stack 202 is formed on a wafer 200 (FIG. 2A). The wafer 200, e.g., a silicon (Si) wafer, comprises doped source and drain regions (wells) 232 and 234 that are separated by a channel region 236 of the transistor.

The film stack 202 generally comprises an electrode layer 206 and a dielectric layer 204. In one embodiment, the electrode layer 206 is a doped polysilicon (Si) layer that is formed to a thickness of about 500 to 6000 Angstroms. The dielectric layer 204 illustratively is formed from hafnium dioxide ($HfO_2$) to a thickness of about 10 to 60 Angstroms. In other embodiments, the layer 204 may comprise at least one film of material having a dielectric constant greater than 4.0 (e.g., $HfSiO_2$, alumina ($Al_2O_3$), and the like). Herein such materials are referred to as high-K materials. The layers 204 and 206 may be provided using a vacuum deposition technique, such as an atomic layer deposition (ALD), a physical vapor deposition (PVD), a chemical vapor deposition (CVD), plasma enhanced CVD (PECVD), evaporation, and the like.

It should be understood, however, that the film stack 202 may comprise layers that are formed from other materials or layers having a different thickness. The invention is generally applicable in processes wherein at least one layer is etched at a high temperature, e.g., about 350 degrees Celsius.

Figure 2B:
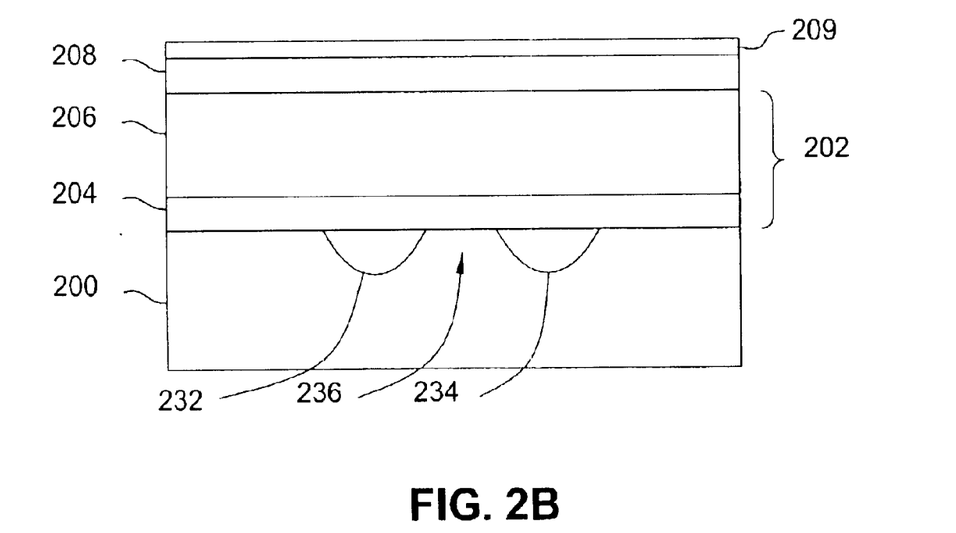

At step 104, an α-carbon layer 208 is applied upon the polysilicon layer 206 (FIG. 2B). The α-carbon material is a high-temperature inorganic carbon material, commonly referred to as amorphous carbon. When used as a mask, α-carbon material is generally coated with an anti-reflective coating (ARC) that is made of SiON. An amorphous carbon film having a anti-reflective coating (ARC) layer on top is available from Applied Materials, Inc. of Santa Clara, Calif. under the trade name Advanced Patterning Film (APF). APF deposition techniques are described in U.S. patent application Ser. No. 09/590,322, filed Jun. 8, 2000, which is herein incorporated by reference. The layer 208 is generally formed to a thickness in a range between 500 and 3000 Angstroms using, e.g., a PECVD process. The ARC layer 209 has a thickness of 250–300 Angstroms. In other embodiments and applications, the layer 208 may have a thickness of about 200 to 5000 Angstroms. Further, the α-carbon layer 208 may be doped with nitrogen ($N_2$). The nitrogen doping generally improves the etch selectivity of the α-carbon material versus other materials used in the film stack 202. In one illustrative embodiment, the layer 208 is formed to a thickness of about 1800 Angstroms. Stability of the α-carbon material at high temperatures (e.g., at 350–500 degrees Celsius and higher) is specifically beneficial while etching the high-K layer 204 (discussed in reference to step 116 below).

Figure 2C:
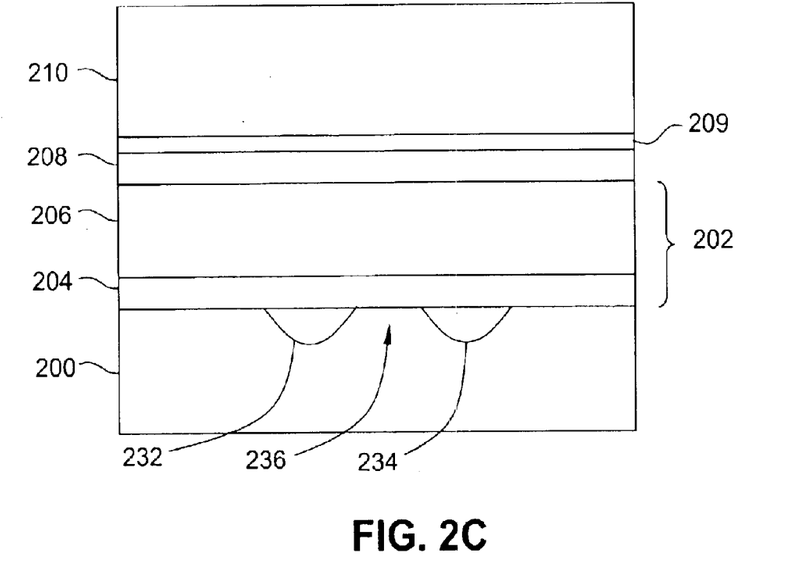

At step 106, a photoresist layer 210 is formed (e.g., to a thickness between 2000 and 6000 Angstroms) upon the ARC layer 209 (FIG. 2C). The photoresist layer 210 may further comprise a sub-layer (not shown) of an anti-reflective coating (ARC) or a bottom anti-reflective coating (BARC) that are used to control a reflection of light during patterning of the photoresist (discussed in reference to step 108 below). The ARC or BARC sub-layer may be composed, for example, from inorganic materials such as silicon oxinitride (SiON), silicon nitride ($Si_3N_4$), silicon carbide (SiC), and the like. Alternatively, the ARC or BARC sub-layer may be composed from organic materials, such as polyamides and polysulfones. As a feature size is reduced, inaccuracies in a pattern transfer process can arise from optical limitations inherent to the lithographic process, such as the light reflection. When applied, the ARC sub-layer is formed upon the photoresist layer 210, while the BARC sub-layer is formed upon the layer 208 or 209. Generally, if the α-carbon layer 208 already has an ARC layer 209, a BARC layer for the photoresist layer 210 is unnecessary. In one illustrative embodiment, the photoresist layer 210 is applied using a conventional procedure to a total thickness of about 3000 Angstroms and comprises the ARC layer formed from silicon oxinitride to a thickness of about 250 Angstroms.

Figure 2D:
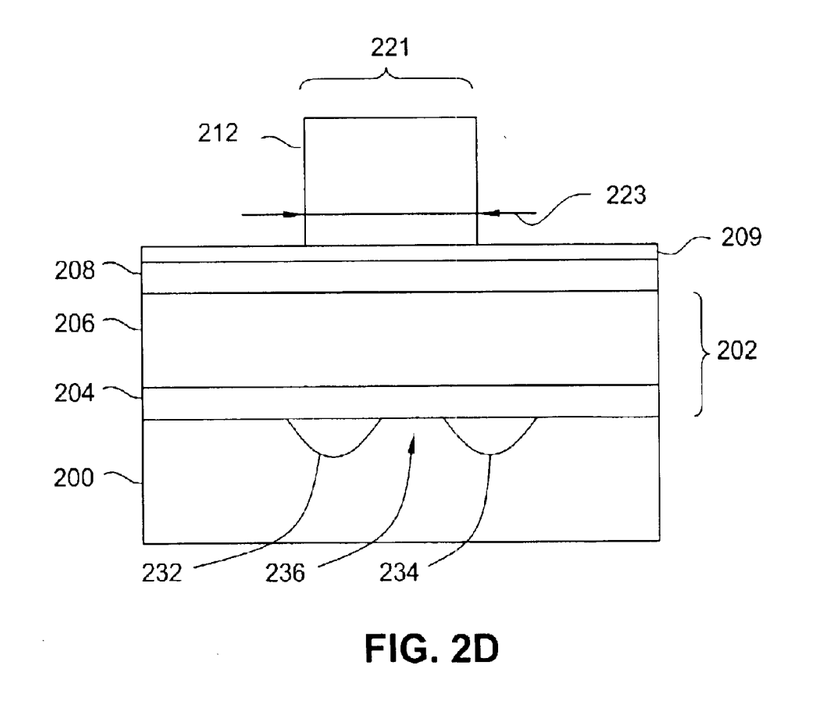

At step 108, the photoresist layer 210 is processed using a conventional lithographic patterning process. During the patterning process, the photoresist layer 210 is exposed through a patterned mask and developed, while an undeveloped portion of the photoresist is removed (FIG. 2D). A remaining developed photoresist is generally a polymer that forms a mask 212. The mask 212 rests over the layer 209 in the region 221. When patterning the photoresist mask, the ARC layer 209 can be used as an etch stop layer. The region 221 is located above the well regions 232 and 234 and the channel region 236. Due to limitations of the lithographic patterning process, critical dimensions of the mask 212 (e.g., a width 223) when formed using the lithographic patterning process, may be in a range of 130 nm or greater. The advanced CMOS transistors require the etch masks having such critical dimensions of less than 100 nm, specifically, of about 65 nm or less and, as such, the width 223 of the mask 212 should be reduced.

Figure 2E:
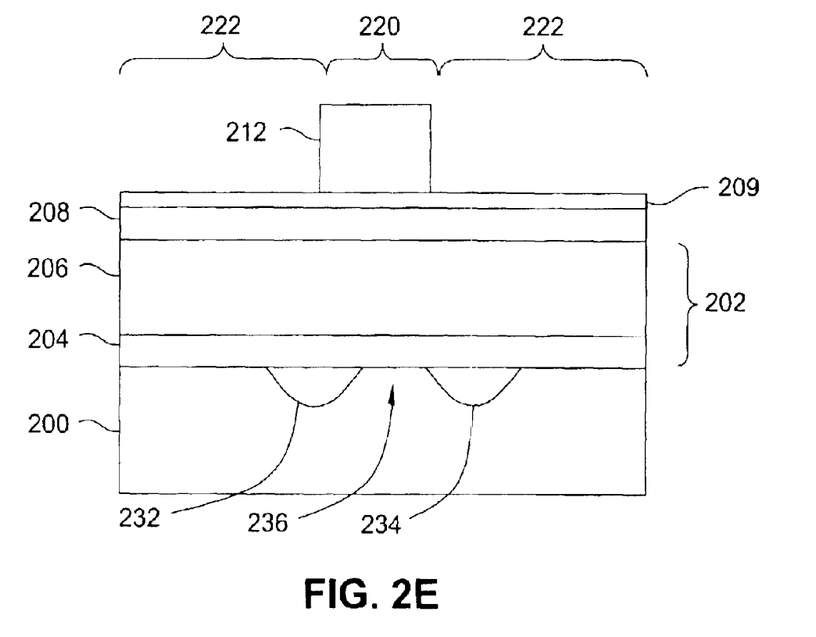

At step 109, the width 223 of the mask 212 is reduced to a desired value (e.g., about 65 nm) using a conventional photoresist mask trimming process (FIG. 2E). The trimming process is a plasma process that uses an oxygen based chemistry to perform an isotropic etching of the photoresist. After step 109, the trimmed mask 212 is positioned over a region 220. During the trimming process, the ARC layer 209 protects the α-carbon from exposure to the chemistry used for trimming. The region 220 is wider than the channel region 236 and, as such, covers the adjacent portions of the well regions 232 and 234. After the trimming, a height of the mask 212 also decreases, as shown in FIG. 2E.

The photoresist mask trimming process is generally used when resolution of the lithographic patterning process is insufficient for transferring an accurate image of the gate structure into the layer 210. However, in certain applications, there is no need in reducing the width 223 of the mask 212 after step 108 and, as such, step 109 may be considered optional.

The photoresist mask trimming process can be performed, e.g., in a Decoupled Plasma Source (DPS or DPS II) of the CENTURA® system. DPS reactor uses an inductive source to produce a high density plasma. The DPS reactor is described in reference to FIG. 3 below.

In one exemplary embodiment when the DPS reactor is used to reduce the width of the mask 212, step 109 provides hydrogen bromide (HBr) at a rate 2 to 200 sccm and oxygen ($O_2$) at a rate 5 to 100 sccm (i.e., a $HBr:O_2$ flow ratio ranging from 1:10 to 10:1), as well as argon (Ar) at a rate of 10 to 200 sccm. Further, step 109 applies source power of 200 to 1000 W and a bias power of 0 to 300 W, while maintains a wafer temperature at 0 to 80 degrees Celsius and a pressure in a reaction chamber at 2 to 30 mTorr. One exemplary process provides HBr at a rate of 60 sccm and $O_2$ at a rate of 28 sccm (i.e., a $HBr:O_2$ flow ratio of about 2.1:1), Ar at a rate of 60 sccm, source power of 600 W, bias power of 100 W, a wafer temperature of 50 degrees Celsius, and a pressure of 4 mTorr.

Figure 2F:
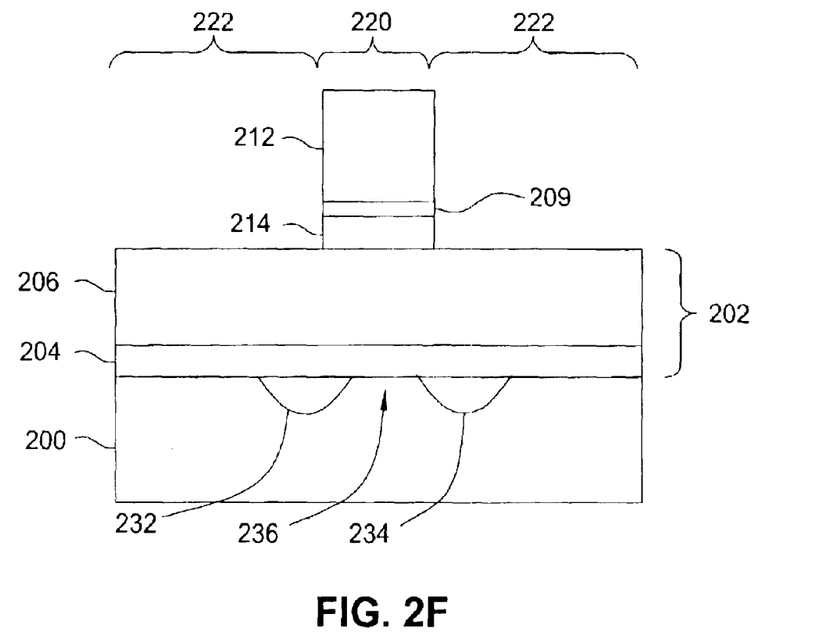

At step 110, the ARC layer 209 and the α-carbon layer 208 are plasma etched and removed in the regions 222 that surround the region 220 (FIG. 2F). A remaining portion of the layers 208 and 209 forms an α-carbon etch mask 214. The α-carbon etch mask 214 defines the location and topographic dimensions of the gate structure being formed using the method 100. In one embodiment, step 110 uses the polysilicon layer 206 as an etch stop layer, e.g., an endpoint detection system of the etch reactor may monitor plasma emissions at a particular wavelength to determine that the layer 208 has been removed in the region 222.

In one embodiment, step 110 uses an etchant gas (or gas mixture) that comprises oxygen and a diluent gas such as argon. Herein the terms "gas" and "gas mixture" are used interchangeably. Such etch process provides relative selectivity to α-carbon over the photoresist of about 0.5:1.

In an illustrative embodiment, when the DPS II reactor is used to form the α-carbon mask 214, step 110 provides hydrogen bromide at a rate 2 to 200 sccm and oxygen at a rate 5 to 100 sccm (i.e., a $HBr:O_2$ flow ratio ranging from 1:10 to 10:1), as well as argon (Ar) at a rate of 10 to 200 sccm. Further, step 109 applies source power of 200 to 1000 W and a bias power of 0 to 300 W, while maintains a wafer temperature at 0 to 80 degrees Celsius and a pressure in a reaction chamber at 2 to 30 mTorr. One exemplary process provides HBr at a rate of 60 sccm and $O_2$ at a rate of 28 sccm (i.e., a $HBr:O_2$ flow ratio of about 2:1), Ar at a rate of 60 sccm, source power of 600 W, bias power of 100 W, a wafer temperature of 50 degrees Celsius, and a pressure of 4 Torr. Alternatively, plasma comprising hydrogen may be used to etch the pattern in the α-carbon film.

Figure 2G:
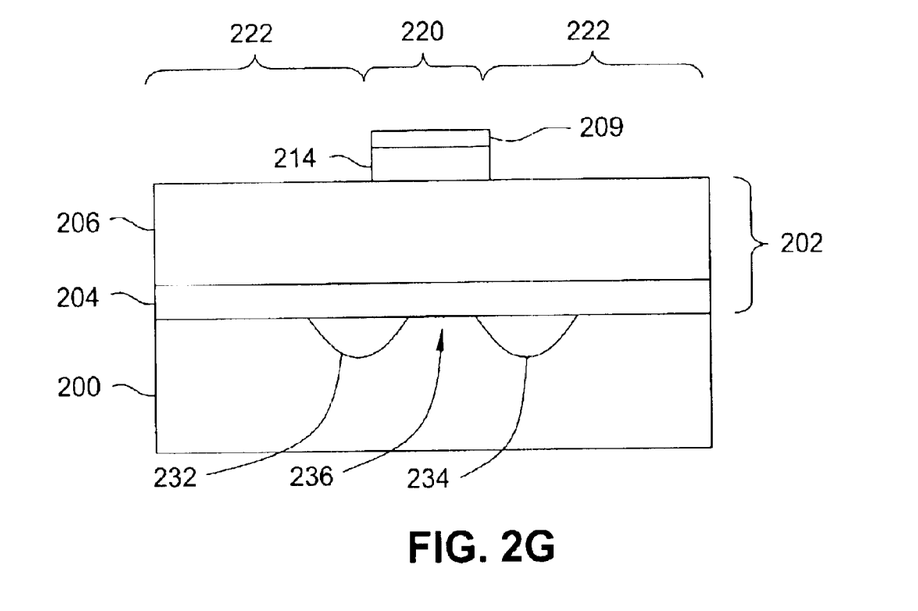

At step 112, the photoresist mask 212 is removed, or stripped, thus leaving the α-carbon etch mask 214 on top of the film stack 202 (FIG. 2G). In one embodiment, step 112 uses the SiON ARC layer 209 as an etch stop layer. Step 112 generally performs a conventional photoresist stripping process that uses a plasma generated from a gas comprising oxygen. In one embodiment, step 112 uses oxygen that is supplied into a reaction chamber in conjunction with nitrogen ($N_2$). Further, nitrogen may optionally be mixed with one or more inert gases such as helium ($He_2$) and the like.

In one embodiment, when the stripping process of is performed in the DPS II reactor, step 112 provides oxygen at a rate of 10 to 200 sccm, as well as nitrogen ($N_2$) at a rate of 0 to 200 sccm, applies 200 to 3000 W of plasma power and 0 to 300 W of bias power, maintains a wafer temperature at 10 to 80 degrees Celsius, and a pressure in the reaction chamber at 2 to 100 mTorr. One specific process recipe provides $O_2$ at a rate of 50 sccm and $N_2$ at a rate of 50 sccm (an $O_2:N_2$ flow ratio of about 1:1), 1000 W of plasma power and 10 W of bias power, a wafer temperature of 50 degrees Celsius, and a pressure of 4 mTorr.

In another embodiment, when the stripping process is performed in the ASP reactor of the CENTURA® system. The ASP reactor is a microwave downstream oxygen plasma reactor in which plasma is confined and only reactive neutrals are allowed to enter a process chamber. Such a plasma confinement scheme precludes plasma-related damage of the substrate or circuits formed on the substrate. The wafer back side may be heated (e.g., radiantly, by quartz halogen lamps) or cooled (e.g., providing an inert gas such as helium to backside of the wafer) to maintain the wafer temperature between 20 to 400 degrees Celsius.

In this embodiment, step 112 provides oxygen at a rate 1000 to 7500 sccm, as well as nitrogen ($N_2$) at a rate of 0 to 500 sccm, applies a microwave power of 500 to 2500 W, maintains a wafer temperature at 100 to 250 degrees Celsius, and a pressure in the reaction chamber at 1 to 10 Torr. One process provides $O_2$ at a rate of 3500 sccm and $N_2$ at a rate of 500 sccm (i.e., an $O_2:N_2$ flow ratio of about 7:1), a microwave power of 1400 W, a wafer temperature of 200 degrees Celsius, and a pressure of 2 Torr.

In another embodiment, during step 112, the stripping process may be performed in a wet cleaning module of the exemplary CENTURA® system using a cleaning solvent. In one embodiment, the solvent comprises, by weight, about (0.1–10) parts of ammonium hydroxide ($NH_4OH$), (0.1–10) parts of hydrogen peroxide ($H_2O_2$), and (1–100) parts of deionized water ($H_2O$). Such solvent is commercially available under trade name SC1 from Rhodia, Inc., Freeport, Tex. and other suppliers. After the treatment, the wafer 200 is rinsed in distilled water to remove any remaining traces of the SC1 solvent. One exemplary recipe comprises 1 part of $NH_4OH$, 1 part $H_2O_2$, and 10 parts of deionized water. The solvent is applied at a temperature of about 45 to 65 degrees Celsius for a duration of about 30 to 120 seconds.

Figure 2H:
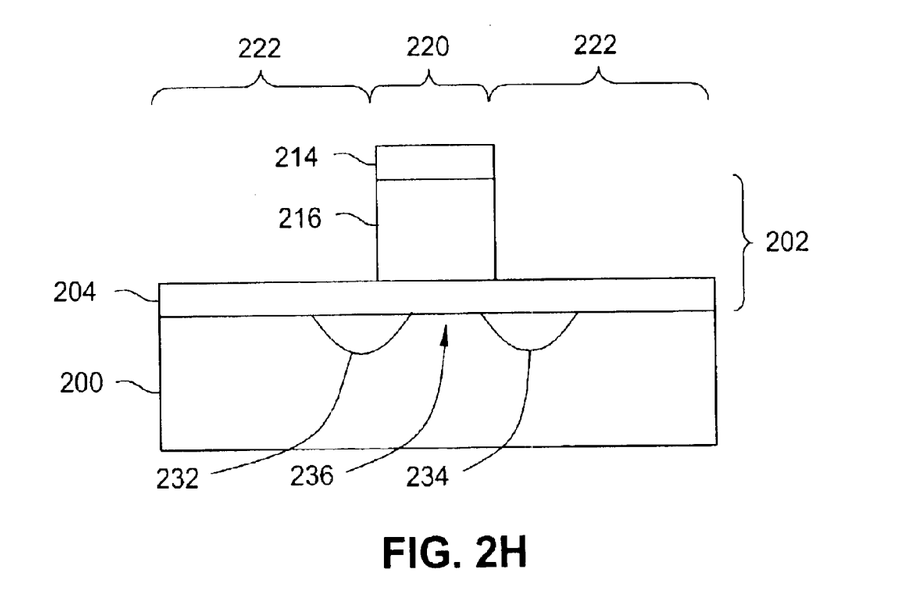

At step 114, the electrode layer 206 is removed in the regions 222 (FIG. 2H). A remaining portion of the layer 206 forms in the region 220 a gate electrode 216, e.g., a polysilicon gate electrode, which rests upon the dielectric layer 204 (FIG. 2G). Step 114 uses the α-carbon mask 214 as an etch mask and the dielectric layer 204, e.g., a hafnium dioxide layer, as an etch stop layer. In one illustrative embodiment, step 114 may perform a plasma etch process using an etchant gas comprising at least one of chlorinated/brominated/fluorinated chemistries such as $Cl_2$, HBr, $CF_4$, and the like. The etch process provides a relative selectivity to polysilicon over $HfO_2$, $HfSiO_2$, $Al_2O_3$, and the like of about 100:1. Such etch process is disclosed in commonly assigned U.S. patent application Ser. No. 10/194,609, filed Jul. 12, 2002, which is incorporated herein by reference. Further, the etch process provides a relative selectivity to polysilicon over the α-carbon mask 214 of about (5–6):1. As such, step 114 can be performed using the α-carbon mask 214 having a thickness of about 500–3000 Angstroms prior to etching of the polysilicon layer 206. The thin ARC layer 209 that forms part of the mask 114 is removed by the polysilicon etchants. Because the polysilicon etch process is performed at a relatively low temperature, about 40 degrees Celsius, and the dielectric etch process is performed at a relatively high temperature, about 350 degrees Celsius, each process is performed in a separate reactor.

In one exemplary embodiment, when the polysilicon etch process of is performed in the DPS II reactor, step 114 provides HBr at a rate of 20 to 300 sccm and chlorine ($Cl_2$) at a rate of 20 to 300 sccm (i.e., a $HBr:Cl_2$ flow ratio ranging from 1:15 to 15:1), as well as nitrogen at a rate of 0 to 200 sccm. Further, step 114 applies 200 to 3000 W of plasma power and 0 to 300 W of bias power and maintains a wafer temperature at 0 to 200 degrees Celsius and a pressure in the reaction chamber at 2 to 100 mTorr. One specific process recipe provides HBr at a rate of 40 sccm and $Cl_2$ at a rate of 40 sccm (i.e., a $HBr:Cl_2$ flow ratio of 1:1), $N_2$ at a rate of 20 sccm, 1100 W of plasma power, 20 W of bias power, a wafer temperature of 45 degrees Celsius, and a pressure of 4 mTorr.

Figure 2I:
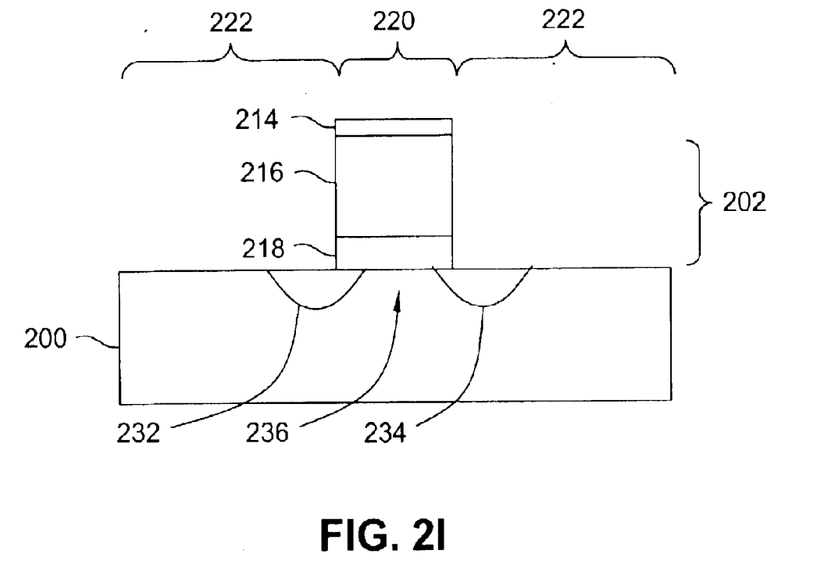

At step 116, the dielectric layer 204 is removed in the regions 222 using a plasma etch process (FIG. 2I). A remaining portion of the dielectric layer 204 forms a gate dielectric 218, e.g., a hafnium dioxide gate dielectric, in the region 220 above the wells 232 and 234 and the channel 236. In one illustrative embodiment, step 116 uses the α-carbon mask 214 as an etch mask and the silicon substrate 200 as an etch stop layer.

Step 116 may use an etchant gas comprising a halogen gas (e.g., chlorine ($Cl_2$), HCl, and the like), as well as a reducing gas such as carbon monoxide (CO). Such dielectric etch process is disclosed in commonly assigned U.S. patent application Ser. No. 10/194,566, filed Jul. 12, 2002, which is incorporated herein by reference. The etch process provides relative selectivity to hafnium dioxide over polysilicon or silicon of about 3:1.

When the α-carbon mask 214 is used during step 116, the etch process provides a relative selectivity to $HfO_2$, $HfSiO_2$, $Al_2O_3$ over the α-carbon mask 214 of about like of about (1–2):1. Specifically, during step 116, the relative selectivity to hafnium dioxide over the mask 214 of about 1:1. As such, step 114 can be performed using the α-carbon mask 214 having a thickness of about 100–200 Angstroms before etching of the hafnium dioxide layer 204 begins.

In one exemplary embodiment, during etching the hafnium dioxide layer 204 in the DPS II reactor, step 116 provides chlorine at a rate of 2 to 300 sccm, as well as and carbon monoxide at a rate of 2 to 200 sccm (i.e., a $Cl_2$:CO flow ratio ranging from 1:5 to 5:1), applies 200 to 3000 W of plasma power and 0 to 300 W of bias power, maintains a wafer temperature at 100 to 500 degrees Celsius, and a pressure in the reaction chamber at 2 to 100 mTorr. One specific process recipe provides $Cl_2$ at a rate of 40 sccm and CO at a rate of 40 sccm (i.e., a $Cl_2$:CO flow ratio of about 1:1), 1100 W from of plasma power and 20 W of bias power, a wafer temperature of 350 degrees Celsius, and a pressure of 4 mTorr.

Figure 2J:
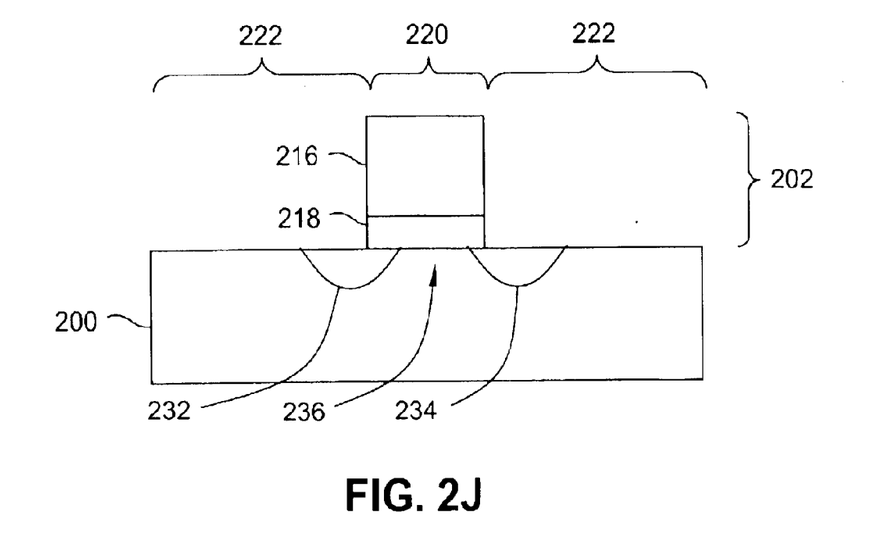

At step 118, the remaining portion of the α-carbon mask 214 is removed from the film stack 202 using a plasma etch process (FIG. 2J). In one illustrative embodiment, step 118 uses the polysilicon gate electrode 216 as an etch stop layer. Further, steps 116 and 118 may be performed in a single etch reactor (i.e., in situ), such as, for example, the referred to above DPS II reactor.

Step 118 can be performed in the DPS II reactor using an oxygen based chemistry, e.g., a gas mixture comprising oxygen and an inert diluent gas, such as argon, helium, and the like. For example, in one illustrative embodiment, step 118 provides oxygen at a rate between 10 and 200 sccm and argon at a rate between 10 to 200 sccm (i.e., a $O_2$:Ar flow ratio ranging from 1:20 to 20:1), applies between 500 and 1500 W of plasma power and between 0 and 500 W of bias power, and maintains a wafer temperature between 50 and 200 degrees Celsius and a pressure between 2 and 20 mTorr. In an alternative embodiment, the remaining α-carbon mask 214 can be removed in the ASP reactor using similar etching chemistry. In a further alternative embodiment, the remaining α-carbon mask can be removed in a hydrogen containing plasma.

At step 120, the method 100 ends.

Figure 3:
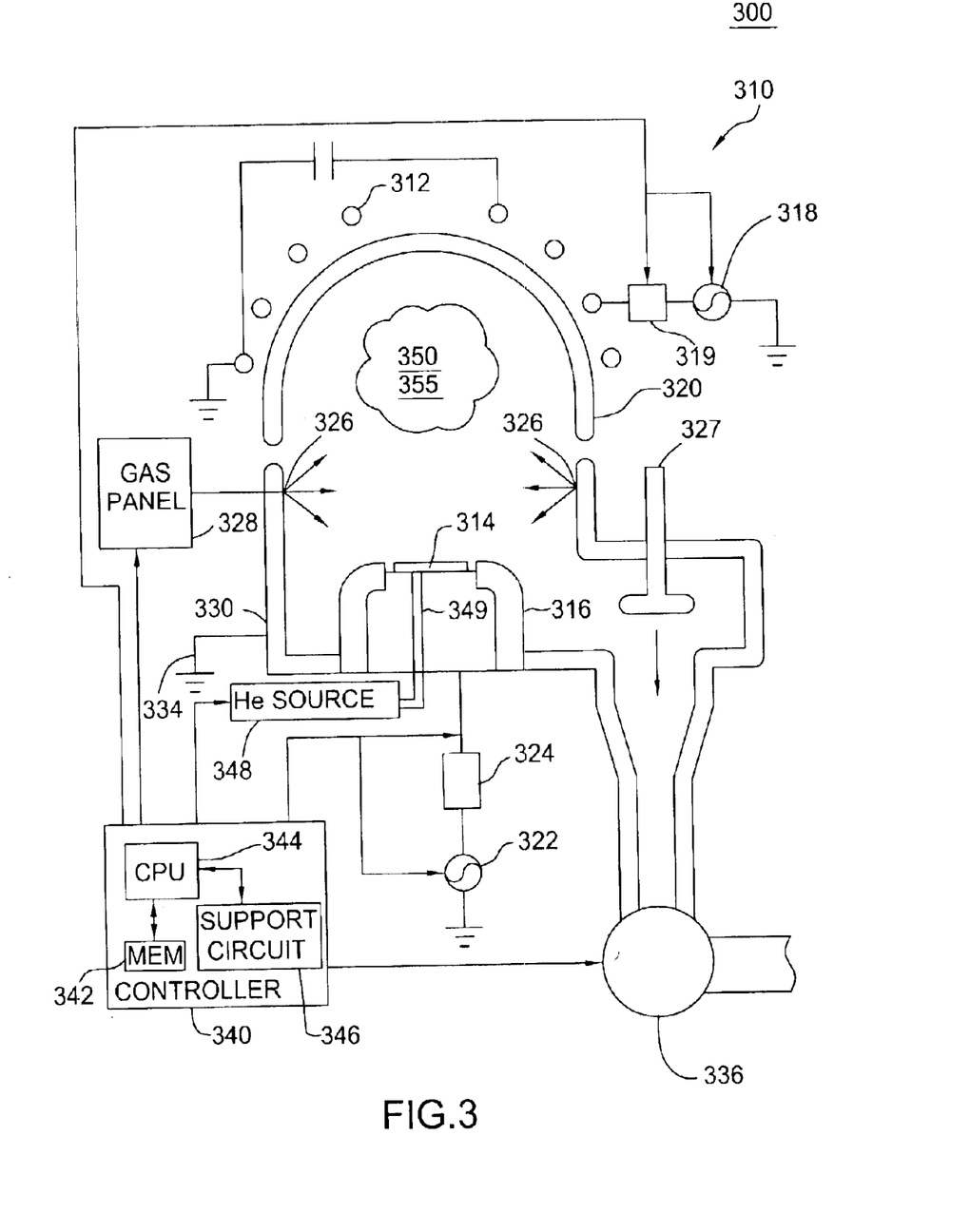
FIG. 3 depicts a schematic diagram of an exemplary plasma processing apparatus of the kind used in performing portions of the method of FIG. 1.

FIG. 3 depicts a schematic diagram of a DPS II etch reactor 300 that may be uses to practice portions of the inventive method 100. The reactor 300 comprises a process chamber 310 having a wafer support pedestal 316 within a conductive body (wall) 330, and a controller 340.

Although the chamber design is the same for etching polysilicon and the dielectric materials, the pedestal 316 used for each process is different. For polysilicon etch, the pedestal is a "low temperature" pedestal that maintains the substrate at about 45 degrees Celsius, while for high K dielectric etch the pedestal is a "high temperature" pedestal that maintains the substrate at up to 500 degrees Celsius. Although both chambers may be integrated using a single platform, e.g., CENTURA® available from Applied Materials, Inc. of Santa Clara, Calif., the substrate is typically moved from one chamber to another to facilitate polysilicon etch and dielectric etch. However, if a single chamber is available that produces rapid temperature control over wide temperature range, a single chamber may be used to perform both polysilicon and dielectric etch.

The support pedestal (cathode) 316 is coupled, through a first matching network 324, to a biasing power source 322. The biasing source 322 generally is capable of producing up to 500 W at a frequency of approximately 13.56 MHz. In other embodiments, the source 322 may be a DC or pulsed DC source. The wall 330 is supplied with a dome-shaped dielectric ceiling 320. Other modifications of the chamber 310 may have other types of ceilings, e.g., a substantially flat ceiling. Typically, the wall 330 is coupled to an electrical ground 334. Above the ceiling 320 is disposed an inductive coil antenna 312. The antenna 312 is coupled, through a second matching network 319, to a plasma power source 318. The plasma source 318 typically is capable of producing up to 3000 W at a tunable frequency in a range from 50 kHz to 13.56 MHz.

A controller 340 comprises a central processing unit (CPU) 344, a memory 342, and support circuits 346 for the CPU 344 and facilitates control of the components of the DPS etch process chamber 310 and, as such, of the etch process, as discussed below in further detail.

In operation, a semiconductor wafer 314 is placed on the pedestal 316 and process gases are supplied from a gas panel 338 through entry ports 326 and form a gaseous mixture 350. The gaseous mixture 350 is ignited into a plasma 355 in the chamber 310 by applying power from the plasma and bias sources 318 and 322 to the antenna 312 and the cathode 316, respectively. The pressure within the interior of the chamber 310 is controlled using a throttle valve 327 and a vacuum pump 336. The temperature of the chamber wall 330 is controlled using liquid-containing conduits (not shown) that run through the wall 330.

The temperature of the wafer 314 is controlled by stabilizing a temperature of the support pedestal 316. In one embodiment, the helium gas from a gas source 348 is provided via a gas conduit 349 to channels formed by the back of the wafer 314 and grooves (not shown) in the pedestal surface. The helium gas is used to facilitate heat transfer between the pedestal 316 and the wafer 314. During the processing, the pedestal 316 may be heated by a resistive heater (not shown) within the pedestal to a steady state temperature and then the helium gas facilitates uniform heating of the wafer 314. Using such thermal control, the wafer 314 is maintained at a temperature of between 0 and 500 degrees Celsius.

Those skilled in the art will understand that other forms of etch chambers may be used to practice the invention, including chambers with remote plasma sources, microwave plasma chambers, electron cyclotron resonance (ECR) plasma chambers, and the like.

To facilitate control of the process chamber 310 as described above, the controller 340 may be one of any form of general purpose computer processor that can be used in an industrial setting for controlling various chambers and sub-processors. The memory, or computer-readable medium, 342 of the CPU 344 may be one or more of readily available memory such as random access memory (RAM), read only memory (ROM), floppy disk, hard disk, or any other form of digital storage, local or remote. The support circuits 346 are coupled to the CPU 344 for supporting the processor in a conventional manner. These circuits include cache, power supplies, clock circuits, input/output circuitry and subsystems, and the like. The inventive method is generally stored in the memory 342 as software routine. The software routine may also be stored and/or executed by a second CPU (not shown) that is remotely located from the hardware being controlled by the CPU 344.

The invention can be practiced in other etch semiconductor processing systems where the processing parameters may be adjusted to achieve acceptable characteristics by those skilled in the art by utilizing the teachings disclosed herein without departing from the spirit of the invention.

Although the forgoing discussion referred to fabricating of the gate structure of a field effect transistor, fabricating of the other structures and features used in the semiconductor integrated circuits and devices can benefit from the invention.

While foregoing is directed to the illustrative embodiment of the present invention, other and further embodiments of the invention may be devised without departing from the basic scope thereof, and the scope thereof is determined by the claims that follow.

What is claimed is:

1. A method of fabricating a gate structure of a field effect transistor on a semiconductor substrate comprising a channel region formed between source and drain regions of said transistor, comprising:
   (a) providing a film stack comprising a gate dielectric layer and an overlying gate electrode layer;
   (b) forming a patterned α-carbon mask on the gate electrode layer, said mask is disposed above the channel region;
   (c) plasma etching the gate electrode layer through the patterned α-carbon mask;
   (d) plasma etching the gate dielectric layer through the patterned α-carbon mask; and
   (e) removing the α-carbon mask.

2. The method of claim 1 wherein the α-carbon mask has a thickness in a range between 200 and 5000 Angstroms.

3. The method of claim 1 wherein:
   the gate electrode layer comprises polysilicon; and
   the gate dielectric layer comprises at least one of $HfO_2$, $HfSIO_2$, and $Al_2O_3$.

4. The method of claim 1 wherein step (b) further comprises:
   (b1) forming a photoresist mask exposing portion of an α-carbon layer;
   (b2) etching the exposed portion of the α-carbon layer using a plasma comprising $O_2$ to form the patterned α-carbon mask; and
   (b3) removing the photoresist mask.

5. The method of claim 4 wherein the step (b2) further comprises:
   providing HBr and $O_2$ at a flow ratio HBr:$O_2$ in a range from 1:10 to 10:1.

6. The method of claim 1 wherein the step (c) further comprises:
   providing HBr and $Cl_2$ at a flow ratio HBr:$Cl_2$ in a range from 1:15 to 15:1.

7. The method of claim 1 wherein the step (d) further comprises:
   providing $Cl_2$ and CO at a flow ratio $Cl_2$:CO in a range from 1:5 to 5:1.

8. The method of claim 1 wherein the step (e) further comprises:
   providing $O_c$ and Ar at a flow ratio $O_2$:Ar in a range from 1:20 to 20:1.

9. The method of claim 4 wherein at least two stops of the steps (b2), (c), (d) and (e) are performed in a single plasma reactor.

10. A method of fabricating a gate structure of a field effect transistor on a semiconductor substrate comprising a channel region formed between source and drain regions of said transistor, comprising:
    (a) providing a film stack comprising a gate dielectric layer formed from $HfO_2$ and a gate electrode layer formed from polysilicon;
    (b) forming a patterned α-carbon mask, said mask is disposed above the channel region;
    (c) plasma etching the gate electrode layer through the patterned α-carbon mask;
    (d) plasma etching the gate dielectric layer through the patterned α-carbon mask; and
    (e) removing the α-carbon mask.

11. The method of claim 10 wherein the α-carbon mask has a thickness in a range between 200 and 5000 Angstroms.

12. The method of claim 10 wherein step (b) further comprises:
    (b1) forming a photoresist mask exposing portion of an α-carbon layer
    (b2) etching the exposed portion of the α-carbon layer using a plasma comprising $O_2$ to form the patterned α-carbon mask; and
    (b3) removing the photoresist mask.

13. The method of claim 12 wherein the step (b2) further comprises:
    providing HBr and $O_2$ at a flow ratio HBr:$O_2$ in a range from 1:10 to 10:1.

14. The method of claim 10 wherein the step (c) further comprises:
    providing HBr and $Cl_2$ at a flow ratio HBr:$Cl_2$ in a range from 1:15 to 15:1.

15. The method of claim 10 wherein the step (d) further comprises:
    providing $Cl_2$ and CO at a flow ratio $Cl_2$:CO in a range from 1:5 to 5:1.

16. The method of claim 10 wherein the step (e) further comprises:
    providing $O_2$ and Ar at a flow ratio $O_2$:Ar in a range from 1:20 to 20:1.

17. The method of claim 12 wherein at least two steps of the steps (b2), (c), (d) and (e) are performed in a single plasma reactor.

18. A computer-readable medium including software that, when executed by a processor, performs a method that causes a reactor to fabricate a gate structure of a field effect transistor on a semiconductor substrate comprising a channel region formed between source and drain regions of said transistor comprising:
    (a) providing a film stack comprising a gate dielectric layer and a gate electrode layer;
    (b) forming a patterned α-carbon mask on the gate electrode layer, said mask is disposed above the channel region;
    (c) plasma etching the gate electrode layer through the patterned α-carbon mask;

(d) plasma etching the gate dielectric layer through the patterned α-carbon mask; and (e) removing the α-carbon mask.

19. The computer-readable medium of claim 18 wherein the α-carbon mask has a thickness in a range between 200 and 5000 Angstroms.

20. The computer-readable medium of claim 18 wherein:

the gate electrode layer comprises polysilicon; and the gate dielectric layer comprises at least one of $HfO_2$, $HfSIO_2$, and $Al_2O_3$.

21. The computer-readable medium of claim 18 wherein step (b) further comprises:

(b1) forming a photoresist mask exposing portion of an α-carbon layer;

(b2) etching the exposed portion of the α-carbon layer using a plasma comprising $O_2$ to form the patterned α-carbon mask; and (b3) removing the photoresist mask.

22. A method of fabricating a gate structure of a field effect transistor on a semiconductor substrate comprising a channel region formed between source and drain regions of said transistor, comprising:

(a) providing a film stack comprising a gate dielectric layer and a gate electrode layer;

(b) forming a patterned α-carbon mask on the gate electrode layer, said mask is disposed above the channel region, wherein step (b) further comprises:

(b1) forming a photoresist mask exposing portion of an α-carbon layer;

(b2) etching the exposed portion of the α-carbon layer using a plasma comprising $O_2$ to form the patterned α-carbon mask; and (b3) removing the photoresist mask;

(c) plasma etching the gate electrode layer;

(d) plasma etching the gate dielectric layer; and (e) removing the α-carbon mask.

\* \* \* \* \*